(12) United States Patent
Kashimura et al.

(10) Patent No.: US 8,716,741 B2
(45) Date of Patent: May 6, 2014

(54) LED PACKAGE AND LED PACKAGE MOUNTING STRUCTURE

(75) Inventors: Takashi Kashimura, Yokohama (JP); Tetsuya Yamazaki, Fujisawa (JP)

(73) Assignee: Hitachi Consumer Electronics Co., Ltd., Tokyo (JP)

( * ) Notice: Subject to any disclaimer, the term of this patent is extended or adjusted under 35 U.S.C. 154(b) by 607 days.

(21) Appl. No.: 12/908,507

(22) Filed: Oct. 20, 2010

(65) Prior Publication Data
US 2011/0242450 A1 Oct. 6, 2011

(30) Foreign Application Priority Data
Mar. 31, 2010 (JP) .................................. 2010-080104

(51) Int. Cl.
*H01L 23/52* (2006.01)

(52) U.S. Cl.
USPC ............................................. 257/99; 257/100

(58) Field of Classification Search
USPC ................................................... 257/99, 100
See application file for complete search history.

(56) References Cited

U.S. PATENT DOCUMENTS

| | | | | |
|---|---|---|---|---|
| 5,315,070 A | * | 5/1994 | Maiwald | 174/250 |
| 5,684,677 A | * | 11/1997 | Uchida et al. | 361/770 |
| 5,901,046 A | * | 5/1999 | Ohta et al. | 361/760 |
| 6,787,884 B2 | * | 9/2004 | Hirano et al. | 257/618 |
| 7,245,024 B2 | * | 7/2007 | Kuhlman et al. | 257/779 |
| 7,425,755 B2 | * | 9/2008 | Liu | 257/666 |
| 7,737,546 B2 | * | 6/2010 | Moy et al. | 257/696 |
| 7,830,022 B2 | * | 11/2010 | Theuss et al. | 257/779 |
| 7,893,545 B2 | * | 2/2011 | Otremba | 257/781 |
| 7,909,480 B2 | * | 3/2011 | Kang et al. | 362/249.02 |
| 8,052,321 B2 | * | 11/2011 | Kim | 362/631 |
| 8,106,506 B2 | * | 1/2012 | Murakami et al. | 257/724 |
| 2005/0093146 A1 | | 5/2005 | Sakano | |
| 2009/0139755 A1 | | 6/2009 | Kusano et al. | |

FOREIGN PATENT DOCUMENTS

| | | |
|---|---|---|
| CN | 101578712 A | 11/2009 |
| JP | 7-115227 A | 5/1995 |
| JP | 8-242019 A | 9/1996 |

OTHER PUBLICATIONS

Chinese Office Action with Partial English Translation dated Feb. 21, 2013 (eight (8) pages).

* cited by examiner

*Primary Examiner* — Eugene Lee
(74) *Attorney, Agent, or Firm* — Crowell & Moring LLP

(57) ABSTRACT

A highly reliable LED package mounting structure which can realize improvement in solder fatigue life at low costs is provided. An LED package has a light-emitting surface which is perpendicular to a mounting surface of a circuit board, comprises connection terminal portions on the side face or on the side face and the bottom face of the package, and is joined with the circuit board by soldering via the connection terminal portion. Furthermore, the shape of the solder is optimized by defining the relative position relation between the end of an electrode on the central side of the LED package on the bottom face of an LED package body and the end of a component mounting pad on the circuit board.

15 Claims, 3 Drawing Sheets

LED PACKAGE AND LED PACKAGE MOUNTING STRUCTURE

CROSS-REFERENCES TO RELATED APPLICATIONS

This application relates to and claims priority from Japanese Patent Application No. 2010-080104, filed on Mar. 31, 2010, the entire disclosure of which is incorporated herein by reference.

BACKGROUND OF THE INVENTION

1. Field of the Invention

The present invention relates to an LED package, an LED package mounting structure comprising an LED package mounted on a circuit board such as a printed circuit board, and a liquid crystal display comprising an LED package mounting structure.

2. Description of the Related Art

In recent years, LEDs are increasingly used as light sources of backlight units for liquid crystal displays of televisions and monitors. This current corresponds to the demands for improved efficiencies of liquid crystal displays, and by using LED light sources, the power consumption and thickness of television sets can be reduced than in conventional cold cathode fluorescent tubes. In particular, by realizing area control, which is controlling LEDs constituting the backlight unit by dividing them into a plurality of groups and controlling the luminance of the LEDs group by group depending on the content of the image, power consumption can be further lowered and high-resolution imaging is achieved.

Backlight systems of liquid crystal displays which allow area control are roughly divided into direct lighting systems and slim block systems. In the direct lighting system, a number of LED light sources are dispersedly disposed within a plane in such a manner that their optical axes are perpendicular to a liquid crystal panel, and the light rays are mixed by a diffuser which is disposed at a point some distance from the light sources to homogenize luminance. Meanwhile, a slim block system is so constituted that a plurality of combinations of a plurality of LEDs and a series of light guide plates are arranged within a plane two-dimensionally, and the LEDs are disposed beside the light guide plates in such a manner that their optical axes are parallel to the liquid crystal panel. A light ray emitted from a light source is, when it is incident from the side face of a light guide plate, totally reflected within the light guide plate, propagated, scattered by reflecting dots or other elements formed on the bottom face of the light guide plate, and is taken out at the top face of the light guide plate. Since the slim block system does not require a space to obtain uniform luminance distribution within the plane, as opposed to the direct lighting system, it can be formed more thinly.

When the slim block system is employed, in order to use a generic upward-lighting type surface mounted LED package (hereinafter referred to as a top-view type LED package) with which the optical axis is perpendicular to the mounting surface of the LED package, a relay board needs to be joined to a circuit board by soldering perpendicularly after LEDs are mounted on the relay board, or the relay board needs to fixed perpendicularly to a chassis and then wired with a connector or other parts. This increases the number of parts and assembly steps and thus increases the costs.

When the side-view type LED package is used, the LEDs are directly mounted on a circuit board such as a printed circuit board, and therefore the costs can be advantageously reduced.

SUMMARY OF THE INVENTION

Mounting the side-view type LED package of Japanese Patent Application Laid-Open Publication No. H7-115227 on a circuit board by soldering entails the problem that the difference in the coefficients of linear expansion between the LED package and the circuit board generates and propagates cracks in the solder joint below the electrodes of the LED package due to changes in temperature caused by turning on/off the LED and finally continuity failure is caused by fatigue fracture of the solder joint.

A possible solution for the problem stated above is increasing the amount of solder provided to increase the solder thickness in the joint portion, but increasing the solder thickness lowers the mounting accuracy of the LED package relative to the circuit board. That is, an increased positional shift of the LED package in the front-back and left-right directions, or inclination or rotation of the light-emitting surface of the LED package in the front-back direction lowers its optical coupling efficiency with the light guide plate. Another possible solution is to employ other connection means such as a thermosetting resin containing solder as a substitution for solder, but it is not practical since it leads to increased costs of components.

In view of the problems mentioned above, an object of the present invention is to provide an LED package and an LED package mounting structure which can improve the fatigue life of solder which electrically connects an LED package and a circuit board even when there is a difference in the coefficients of linear expansion between the LED package and the circuit board, and prevent continuity failure at low costs.

The above object can be achieved by an LED package comprising an LED element mounted on a package body, the package body being mounted on a circuit board in such a manner that its light-emitting surface intersects the mounting surface, and the LED package comprising a first connection terminal portion for connecting with the circuit board on the side face of the package.

The above object can be also achieved by an LED package mounting structure comprising an LED package and a circuit board on which the LED package is mounted, the LED package and the circuit board being electrically connected by soldering, the LED package having a light-emitting surface in the direction of intersecting the mounting surface of the circuit board, comprising a first connection terminal portion on the side face of the package, and being joined with the circuit board by soldering via the connection terminal portion.

Furthermore, the above object can be achieved by an LED package mounting structure comprising an LED package, and a connection terminal portion for connecting with a circuit board on the bottom face of the package, the LED package mounting structure being mounted on the circuit board in such a manner that a light-emitting surface of the LED package intersects the mounting surface via the connection terminal portion, in which in a cross section of the mounting structure in the direction of the LED light-emitting surface, an electrode on the bottom face of the LED package body is formed in a curved shape at an end portion of the electrode on the central side of the LED package, and when the curved portion is approximated to a curved line and the intersection of the tangent at the electrode end (P) and the circuit board is (Q), the end of the component mounting pad (R) on the central side of the LED package of the circuit board is located at point (Q) or located closer to point (P) than point (Q).

Furthermore, the above object can be achieved by an LED package mounting structure comprising an LED package and a connection terminal portion for connecting with a circuit board on the bottom face of the package, the LED package mounting structure being mounted on the circuit board in such a manner that a light-emitting surface of the LED package intersects the mounting surface via the connection terminal portion, wherein in a cross section of the LED package mounting structure in the direction of the LED light-emitting surface, an electrode on the bottom face of the LED package body is formed in a curved shape at an end portion of the electrode on the central side of the LED package, and when the outline of the solder portion is approximated to a curved line, the inclination of the tangent of the outline of the solder is continuous at the end (P) of the electrode.

According to the present invention, even when there is a difference in the coefficients of linear expansion between the LED package and the circuit board, the fatigue life of solder which electrically connects the LED package and the circuit board can be improved, and the LED package and LED package mounting structure which can prevent continuity failure can be provided at low costs.

BRIEF DESCRIPTION OF THE DRAWINGS

The present invention will become fully understood from the detailed description given hereinafter and the accompanying drawings, wherein.

DESCRIPTION OF THE PREFERRED EMBODIMENTS

When a side-view type LED package is mounted on a circuit board by soldering as in Japanese Patent Application Laid-Open Publication No. H7-115227, cracks occur and propagate in the soldered joint below the electrodes of the LED package due to changes in temperature caused by turning on/off the LEDs, and finally continuity failure is caused by solder fatigue fracture. This results from generation of stress caused by thermal deformation in the solder portion since the coefficient of linear expansion of the LED package is lower than that of the circuit board. In particular, ceramic materials are often used for LED package bodies for television applications from a perspective of ensuring reliability of the LED package, while printed circuit boards using inexpensive organic resin materials are often used as circuit boards from a perspective of reducing component costs. This makes the problem of solder fatigue fracture more serious because of the large difference in the coefficients of linear expansion between those materials. Furthermore, in side-view type packages, it is difficult to provide a large area for electrodes of the package as in top-view type packages. The small connection area between the package and solder, and voids generated in the solder due to burrs produced in electrode portions of the package during a dicing process for dividing the assembled board of the LED package into individual pieces, have been main causes of shortening the time until continuity failure occurs.

Embodiments of the present invention conducted in view of the problems mentioned above will be described below with reference to accompanying drawings.

First Embodiment

Figure 1:
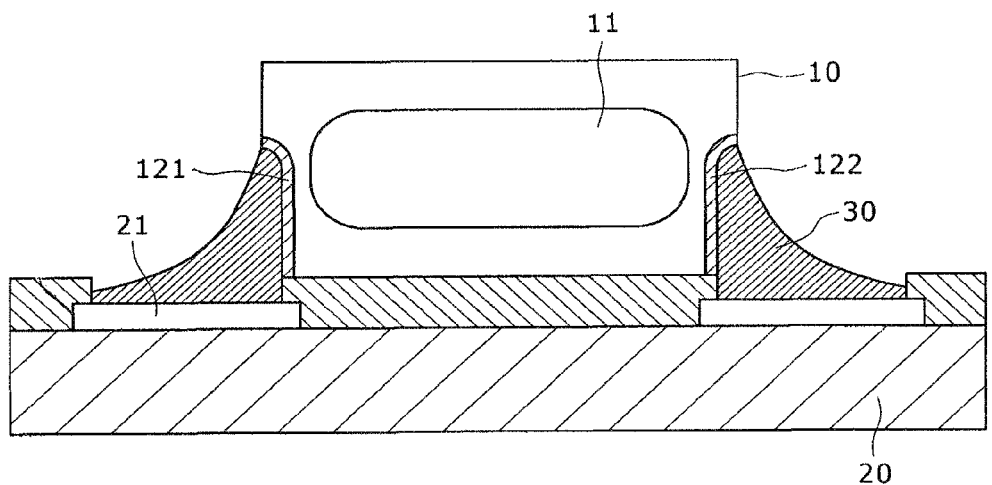
FIG. 1 is a schematic front cross-sectional view of the LED package and LED package mounting structure according to a first embodiment of the present invention.

FIG. 1 shows a schematic front cross-sectional view of an LED package and an LED package mounting structure according to the first embodiment of the present invention.

The LED package mounting structure comprises a surface mount type LED package 10 which is electrically connected to a circuit board 20 via solder. Herein, the LED package 10 has a case made of a ceramic sintered body produced by laminating a plurality of green sheets comprising alumina as a main component and calcining the same, and an LED element (not shown) is mounted inside the case. As the ceramic material, aluminium nitride, silicon carbide and beryllium oxide may be used, in addition to alumina. A resin package such as polyamide may be used in place of the ceramic package mentioned above.

The material used for the circuit board on which the LED package is mounted may be relatively inexpensive organic resin substrates such as glass epoxy board, as well as ceramic-based substrates having excellent reliability and metal-based substrates having excellent thermal conductivity, and is not particularly limited.

The LED package is mounted in such a manner that its light-emitting surface 11 (parallel to the plane of the paper) is perpendicular to the mounting surface (perpendicular to the plane of the paper) of the circuit board (in an intersecting manner). The LED package has, in a state of being mounted, connection terminal portions 121, 122 on its side faces which are perpendicular to (intersecting) the light-emitting surface and the mounting surface. The connection terminal portions 121, 122 each has a metallized layer comprising, for example, W or Mo, which is covered with Ni metal plating and Au metal plating or Ni metal plating and Ag metal plating. The connection terminal portions have two pads for an anode electrode and a cathode electrode corresponding to the p-side electrode and n-side electrode of the LED element, respectively. The side face anode electrode pad 121 and side face cathode electrode pad 122 can have any size as long as they can be installed on the side faces of the package.

The connection terminal portions are connected to component mounting pads 21 on the circuit board via solder 30. Herein, in the component mounting pad (or solder resist opening portion) on the side of the circuit board 20 connected with the connection terminal portions 121 and 122 of the LED package, the size of the side parallel to the light-emitting surface 11 of the package 10 (hereinafter referred to as size A) is desirably 0.5 to 2 times the pad size in the height direction of the connection terminal portions 121, 122 of the package (hereinafter referred to as size B). When size A is smaller than 0.5 times size B or larger than twice size B, the solder fillet is not formed to have an appropriate shape, failing to improve solder fatigue life.

The area of the component mounting pad on the circuit board side connected with the connection terminal portions of the package (or the area of the solder resist openings) is preferably as large as possible within such a range that an appropriate solder fillet shape is formed. This is because a large pad area provides a large connection area of the solder, which results in an improvement of radiation characteristic and a reduction in heat stress caused by turning on/off the LED, and an increase in the effective path length until the solder completely fractures.

A material used for the solder 30 used to connect the LED package and the circuit board is preferably tin-silver binary eutectic solder having excellent thermal fatigue characteristics, tin-silver-copper ternary eutectic solder or tin-zinc-based solder. Specific examples include Sn-3.5Ag (melting point: about 221° C.), Sn-3Ag-0.5Cu (melting point: about 217° C.), Sn-9Zn (melting point: about 199° C.), among others. It goes without saying that tin-lead eutectic alloy, which has been often used and has excellent joining property and fatigue life characteristics, is also usable.

A method for producing the LED package mounting structure will be now described. When the LED package is connected to the circuit board, the component mounting pad on the circuit board is preliminarily provided with solder by paste printing, dispenser application, metal plating or other means.

The LED package 10 is transferred with the connection terminal portions 121, 122 facing down by a component mounting machine or other means, and is mounted on the circuit board so that it is contained between the anode and cathode pads for component mounting with solder applied. The circuit board 20 with the LED package 10 mounted thereon is conveyed on a belt into a reflow furnace. After the circuit board is heated inside the reflow furnace for a certain period of time at a temperature not lower than the melting point of the solder to once fuse the solder, the circuit board is drawn out from the reflow furnace by belt conveyance. The reflow furnace has some heating zones with different temperature settings. After the circuit board passes through the heating zone with the highest temperature setting, it is gradually cooled so that the solder is re-solidified.

The optimization of the fillet shape of the solder and the prevention of rise failure of the LED package 10 according to the embodiment described above can be realized by optimizing the amount of the solder provided and used, the size of the solder resist opening and the size of the pads of the circuit board, among other elements.

According to the mounting structure of the LED package of the embodiment, the connection terminal portions are provided on the side face of the LED package, and a large area of the solder joint between the LED package and the circuit board on which the LED package is mounted can be provided. Therefore, even when there is a difference in the coefficients of linear expansion between the LED package and the circuit board, the fatigue life of solder which electrically connects the LED package and the circuit board can be improved, and continuity failure can be prevented.

Second Embodiment

Figure 2:
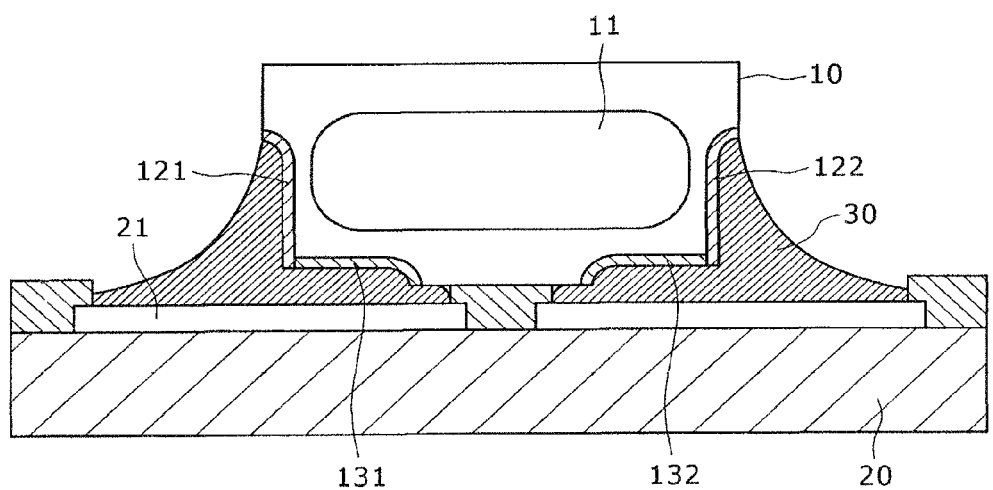
FIG. 2 is a schematic front cross-sectional view of the LED package and LED package mounting structure according to a second embodiment of the present invention.

FIG. 2 shows a schematic front cross-sectional view of an LED package and an LED package mounting structure according to the second embodiment of the present invention. The embodiment is a partial modification of the first embodiment above, where like portions having similar functions to those in the above-described embodiment are designated by like numerals, and detailed description for like parts are omitted.

The material of the LED package in the LED package mounting structure according to the second embodiment and the material of the circuit board on which the LED package is mounted are the same as those in the LED package mounting structure of the first embodiment. However, the LED package mounting structure according to the second embodiment has a structural difference from that according to the first embodiment. The LED package mounting structure according to the second embodiment is characterized in that it has connection terminal portions not only on the side face of the LED package, but also on the bottom face.

Figure 3:
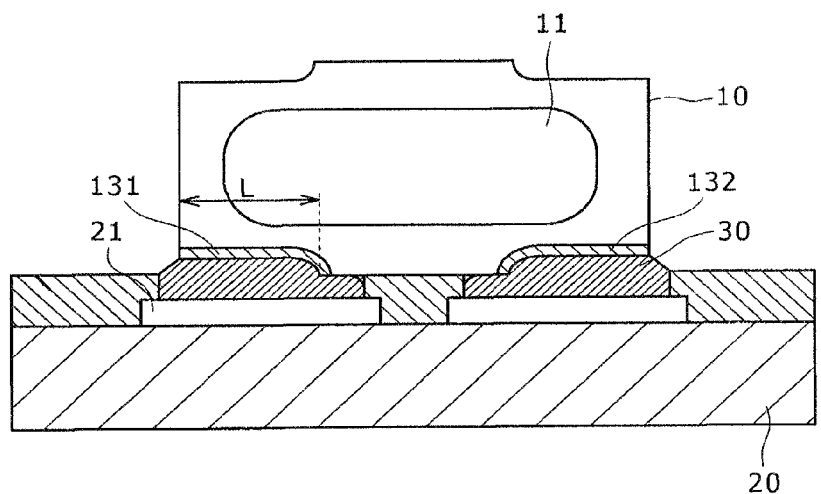
FIG. 3 is a schematic front cross-sectional view of the LED package and LED package mounting structure according to Comparative Example 1 of the present invention.

That is, the LED package in the LED package mounting structure according to the second embodiment is mounted in such a manner that its light-emitting surface 11 is perpendicular to (intersecting) the mounting surface of the circuit board, and has, in a state of being mounted, second connection terminal portions 131, 132 for connecting with the circuit board on the bottom face of the package, and as in the first embodiment, first connection terminal portions 121, 122 for connecting with the circuit board on the side face of the package perpendicular to (intersecting) the light-emitting surface and the mounting surface. The connection terminal portions each has a metallized layer comprising, for example, W or Mo which is covered with Ni metal plating and Au metal plating or Ni metal plating and Ag metal plating. The first and second connection terminal portions have two pads for an anode electrode and a cathode electrode corresponding to the p-side electrode and n-side electrode of the LED element. In this case, like poles of the first connection terminal portion and second connection terminal portion (121 in FIG. 2 and 131 in FIG. 3, 122 in FIG. 2 and 132 in FIG. 3) may be continuous and connected without being separated on the surface of the package, or may be separate and independent on the surface of the package and electrically connected by the internal wiring of the package.

The method for producing the solder material used to connect the LED package and circuit board, and the LED package mounting structure is similar to that described in the first embodiment.

In order to confirm the effects of the LED package mounting structure according to the first and second embodiments of the present invention, the results of simulation analysis will be described below. The fatigue life in the solder joint portion is represented by the sum of the lifetime until a minute crack initiates in the solder joint portion (crack initiation life) and the lifetime until the crack propagates and the solder joint portion fractures after the crack initiation life (crack propagation life). In order to determine the fatigue life of the solder joint portion, a crack propagation analysis for simulating a heat cycle test was conducted. An evaluation method which takes the cumulative damage of the solder into consideration was used for the analysis. This method automatically calculates the path and speed of crack propagation by evaluating the life of the solder in each position based on the damage accumulated at crack initiation and propagation. In the LED package mounting structure to be analyzed, an LED package having the size of 0.8 mm (length)×3 mm (width)×1.4 mm (height) is mounted on one side of the circuit board having the size of 0.96 mm (length)×13.04 mm (width)×0.4 mm (thickness). As the LED package, a model (First Embodiment) in which a connecting terminal having the size of 0.92 mm (length)×0.8 mm (width) is disposed on the side face and, as a comparison, a model (Comparative Example 1) in which a connecting terminal having the size of 0.8 mm (length)×0.92 mm (width) is disposed on the bottom face were examined. The analysis was conducted on a ½ scale model of the mounting structure, considering symmetry.

The materials and property values of each component used for the analytic models are shown in Table 1. The material of the LED package body was alumina, while the circuit board with the LED package mounted thereon was a printed circuit board using an epoxy resin. It was assumed that the solder was a temperature-dependent elasto-plastic solid, and that other materials were temperature-independent elastic bodies. The temperature cycle conditions were 125° C./−55° C. The fracture life of the solder based on the results of the analysis is shown in Table 2.

TABLE 1

| Component | Material | Linear expansion coefficient (ppm/° C.) | Young's modulus (GPa) | Poisson's ratio |
|---|---|---|---|---|
| LED package | Alumina | 6.3 | 380 | 0.3 |
| Circuit board | Epoxy resin | 15 | 23 | 0.16 |
| Solder | Sn—3Ag—0.5Cu | 23 | 41.3 (−50° C.)<br>40.8 (−15° C.)<br>38.2 (26° C.)<br>35.5 (75° C.)<br>33.8 (125° C.) | 0.35 |

TABLE 2

| | Position of electrode on package | Electrode size (mm) | Fracture life (cycle) |
|---|---|---|---|
| First Embodiment | Side face | 0.92 × 0.8 | 1211 |
| Second Embodiment | Side face + bottom face | 0.92 × 0.8 (side)<br>0.8 × 0.92 (bottom) | >1211 |
| Comparative Example 1 | Bottom face | 0.8 × 0.92 (bottom) | 1000 |

As can be seen from Table 2, the samples of the first and second embodiments have larger numbers of cycles until the solder fractures than that of Comparative Example 1, indicating that effects in improving solder fatigue life were obtained by the LED package mounting structure according to the present invention.

As mentioned above, according to the embodiment, by joining the package to the circuit board by soldering via the first and second connection terminal portions, a larger area of the solder joint between the package and the circuit board can be provided than in the first embodiment. Therefore, even when there is a difference in the coefficients of linear expansion between the LED package and the circuit board, the fatigue life of the solder which electrically connects the LED package and the circuit board can be improved than that in the first embodiment, and continuity failure can be prevented.

Third Embodiment

Figure 5:
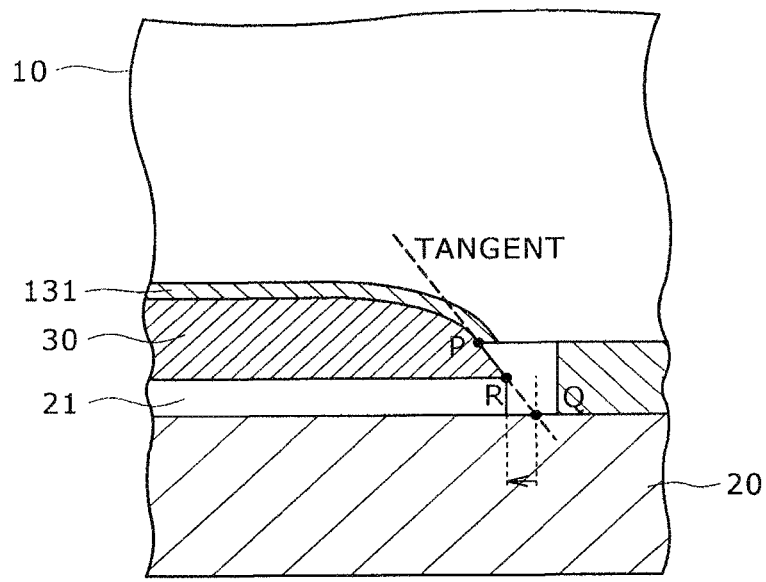
FIG. 5 is an enlarged cross-sectional view of an electrode portion on the bottom face of the package in the LED package and LED package mounting structure according to a third embodiment of the present invention (substrate pad: NSMD structure)

FIG. 5 shows an enlarged cross-sectional view of the electrode portion on the bottom face of the package in the LED package and LED package mounting structure according to the third embodiment of the present invention. In the LED package mounting structure according to the third embodiment, as in the LED package mounting structure according to the second embodiment of the present invention shown in FIG. 2, connection terminal portions may be provided on the bottom face and side face, respectively, of the LED package, or as in the LED package mounting structure according to Comparative Example 1 shown in FIG. 3, the connection terminal portions may be provided only on the bottom face of the LED package. In either case, the LED package and LED package mounting structure according to the third embodiment of the present invention comprise the connection terminal portions for connecting with the circuit board on at least the bottom face of the LED package, and are mounted on the circuit board via the connection terminal portions in such a manner that the light-emitting surface is perpendicular to the mounting surface.

The LED package mounting structure according to the third embodiment of the present invention is characterized in that the shape of the solder is optimized by defining the relative position relation between the electrode on the bottom face of the LED package body and the component mounting pad on the circuit board. That is, in the LED package mounting structure according to the third embodiment of the present invention, in a cross section of the mounting structure taken parallel to the LED light-emitting surface (a cross section in the direction of the LED light-emitting surface), the electrode on the bottom face of the LED package body is formed in a curved shape at an end portion of the electrode on the central side of the LED package, and when the curved portion is approximated to a curved line and the intersection of the tangent at the electrode end (P) and the circuit board is (Q), an end (R) of the component mounting pad on the central side of the LED package of the circuit board is located at point (Q), or is located closer to point (P) rather than point (Q). By defining the relative position relation between the end of the electrode on the bottom face of the LED package body and the end of the component mounting pad on the circuit board as in the present invention, generation of singular points, where stress is likely to be concentrated, can be prevented in the solder portion, thereby improving solder fatigue life.

Figure 4:
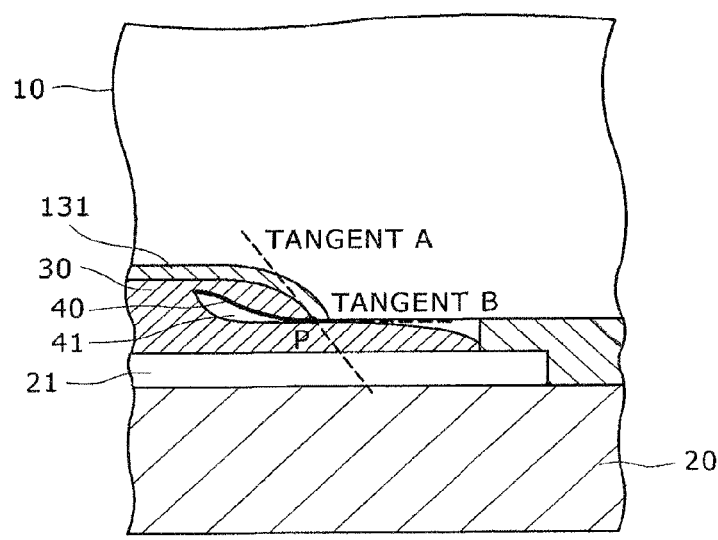
FIG. 4 is an enlarged cross-sectional view of an electrode portion on the bottom face of the package in the LED package and LED package mounting structure according to Comparative Example 2 of the present invention.

Unlike the present invention, when the pad end (R) is located closer to the center of the package than point (Q) (in FIG. 5, right to point (Q)), as Comparative Example 2 shown in FIG. 4, in a cross section of the LED package mounting structure taken parallel to the LED light-emitting surface (a cross section in the direction of the LED light-emitting surface), when the outline of the solder portion is approximated to a curved line, as for the one-sided differential coefficient at the end (P) of the electrode of the package, a singular point where the left-sided differential coefficient and right-sided differential coefficient (equivalent to the inclination of tangent A and tangent B in FIG. 4) do not match (that is, the inclinations of the tangents vary) is generated. Since stress is likely to be concentrated at the singular point, the fatigue life of the solder is reduced. In addition, when the end (R) of the pad is located closer to the central side of the package than point (Q), as Comparative Example 2 shown in FIG. 4, voids are likely to remain in the solder as a result. This is because of the following reason: in the electrode portion of the package, a burr 40 is generated during a dicing process for dividing the assembled board of the LED package into individual pieces, and the surface of the metallized layer comprising W or other elements with no metal plating film formed thereon is exposed. The surface of this metallized layer comprising W and other elements has poor solder wettability, and therefore a void 41 is likely to be generated on its exposed surface. In particular, in the case of Comparative Example 2 shown in FIG. 4, there is no gap or only a small gap between the LED package body 10 and the solder 30 in the vicinity of the burr 40 of the connection terminal portions 131, 132. Accordingly, the void 41 generated during reflow of the solder 30 remains without being removed, and the fatigue life of the solder 30 is reduced. In other words, when the shape of the solder is optimized by defining the relative position relation between the electrode on the bottom face of the LED package body 10 and the component mounting pad on the circuit board 20 as in the present invention, the void 41 is easily removed, resulting in improved solder fatigue life.

When the end (R) of the pad is located closer to point (P) than point (Q) (in FIG. 5, left to point (Q)), assuming that the length of the electrode at the bottom of the package is L, (R) is preferably located closer to the center of the package than the position (0.9×L) from the side face side of the package. In this case, since the joint area between the solder and the electrode of the package is increased than in the case where (R) is located closer to the side face of the package than the position (0.9×L) from the side face side of the package, the effective path length until the occurrence of complete rupture of the solder is increased.

Figure 6:
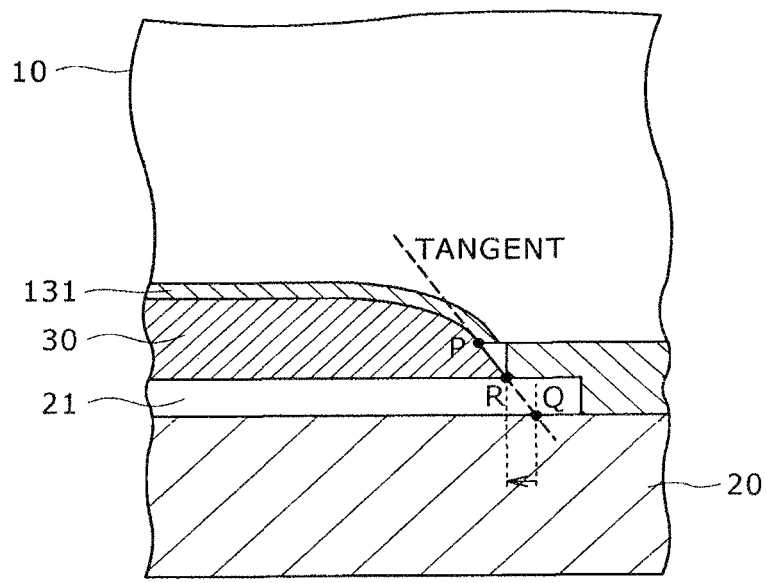
FIG. 6 is an enlarged cross-sectional view of an electrode portion on the bottom face of the package in the LED package and LED package mounting structure according to the third embodiment of the present invention (substrate pad: SMD structure).

The structure of the component mounting pad on the circuit board side may be the NSMD (Non Solder Mask Defined) structure, where the solder resist does not cover the end of the pad as shown in FIG. 5, or may be the SMD (Solder Mask Defined) structure, where the solder resist covers the surface of the end of the pad as shown in FIG. 6. In this case, the end of the pad is employed as point (R) in the NSMD structure, while the end of the opening of the solder resist is employed as point (R) in the SMD structure.

The results of the solder fatigue life evaluation conducted in real device testing to confirm the effects of the LED package mounting structure according to the third embodiment of the present invention will be described.

The materials of the LED package, circuit board and solder used in the test are the same as those used in the simulation analysis of the first and second embodiments (refer to Table 1).

The size of the LED package is 1 mm (length)×3 mm (width)×1.4 mm (height), and an anode and a cathode each having the size of 0.8 mm (length)×0.9 mm (width) are disposed on the bottom face of the package at an interval of 1.2 mm.

The LED package was mounted on the circuit board by soldering in the manner described above. The size of the circuit board pad was 0.9 mm (length)×1.0 mm (width) both on the anode and cathode side, and the interval between the pads was 1.1 mm (Third Embodiment). As a comparison, a sample with the size of the circuit board pad of 0.9 mm (length)×1.1 mm (width) and an interval between the pads of 0.9 mm was also prepared (Comparative Example 2). The thickness of the solder after being mounted was 50 μm. In the sample of the third embodiment, the pad end (R) of the circuit board was located closer to the side face side of the package than point (Q), while in the sample of Comparative Example 2, the pad end (R) of the circuit board was located closer to the central side of the package than point (Q). Furthermore, in the sample of the third embodiment, the outline of the solder in a cross section was in the form a uniform curve. In contrast, in the sample of Comparative Example 2, as for the one-sided differential coefficient at the end (P) of the electrode of the package, a singular point where the left-sided differential coefficient and the right-sided differential coefficient do not match was generated. That is, in the sample of the third embodiment, when the outline of the solder in a cross section is approximated to a curved line, the inclination of the tangent at the end (P) of the electrode of the package is continuous (changing smoothly). In contrast, in the sample of Comparative Example 2, when the outline of the solder in a cross section is approximated to a curved line, a singular point where the inclination of the tangent at the end (P) of the electrode of the package is discontinuous (abruptly changing) is formed.

The test samples were fed into a temperature cycling test chamber (125° C./−55° C.) at ΔT=180° C., and were drawn out after a certain number of cycles. The samples were embedded in resin, and then cut with a diamond cutter to polish their cross sections. The crack propagation rate (average, n=4) of the solder determined by photographing the ground surfaces with a scanning electron microscope (SEM) are shown in Table 3. The crack propagation rate expresses the ratio of the crack length to the contact length between the electrode of the LED package and the solder in the actual cross section.

TABLE 3

| | Crack propagation rate (%) | | |
|---|---|---|---|
| | 500 cycles | 1000 cycles | 1250 cycles |
| Third embodiment | 7.1 | 14.3 | 24.0 |
| Comparative Example 2 | 18.5 | 67.2* | |

*Including samples which have caused complete fracture

As can be seen from Table 3, the sample of the third embodiment had a slower rate of crack propagation than that of Comparative Example 2, indicating that improvement in solder fatigue life has been achieved by the LED package mounting structure according to the present invention.

As mentioned above, according to the third embodiment of the present invention, by defining the relative position relation between the end of the electrode of the central side of the LED package on the bottom face of the LED package body and the end of the component mounting pad on the circuit board to optimize the shape of the solder in a cross section of the LED package mounting structure taken parallel to the LED light-emitting surface (a cross section in the direction of the LED light-emitting surface), the generation of the singular point where stress is likely to be concentrated can be prevented, and further voids in the solder formed by burrs generated in the electrode portion of the package can be prevented. Therefore, even when there is a difference in the coefficients of linear expansion between the LED package and the circuit board, the fatigue life of solder which electrically connects the LED package and the circuit board can be improved, and continuity failure can be prevented.

Although the LED package and the LED package mounting structure according to the present invention have been described in the first to third embodiments, the present invention can be applied to liquid crystal displays comprising the LED package and LED package mounting structure described in the first to third embodiments.

The embodiments described above are only specific embodiments for carrying out the present invention, and the technical scope of the present invention must not be construed to be limited by them. The present invention can be carried out in various forms without departing from the spirit and principal feature of the invention.

What is claimed is:
1. An LED package mounting structure comprising:
an LED package;
a first connection terminal portion that is disposed on a side face of the LED package;

a second connection terminal portion that is disposed on a bottom face of the LED package; and
a circuit board on which the LED package is mounted, wherein:
the LED package comprises a light-emitting surface that is perpendicular to a surface of the circuit board on which the LED package is mounted,
the first connection terminal portion and the circuit board are electrically connected by soldering, and
in a cross section of the LED package mounting structure, in a direction of the light-emitting surface, the second connection terminal portion is formed in a curved shape at an end portion on a central side of the LED package.

2. The LED package mounting structure according to claim 1, wherein the second connection terminal portion and the circuit board are electrically connected by soldering.

3. The LED package mounting structure according to claim 2, wherein:
when the curved shape is approximated to a curved line and an intersection of a tangent at an end (P) of the second connection terminal portion and the circuit board (Q), an end of a component mounting pad (R) on the central side of the LED package of the circuit board is located at point (Q) or is located closer to point (P) than point (Q).

4. The LED package mounting structure according to claim 2, wherein:
when an outline of a solder portion is approximated to a curved line, as for a one-sided differential coefficient at the end (P) of the second connection terminal portion, a left-sided differential coefficient and a right-sided differential coefficient are identical.

5. An LED package mounting structure comprising:
an LED package; and
a connection terminal portion disposed on a bottom face of the LED package, wherein:
the connection terminal portion is configured to connect to a circuit board,
the LED package mounting structure is mounted on the circuit board in such a manner that a light-emitting surface of the LED package is perpendicular to a mounting surface, in a cross section of the mounting structure taken parallel to the light-emitting surface,
the connection terminal portion is formed in a curved shape at an end portion on a central side of the LED package, and
when the curved shape is approximated to a curved line and an intersection of a tangent at an end (P) of the connection terminal portion and the circuit board (Q), an end (R) of a component mounting pad on the central side of the LED package of the circuit board is located at point (Q), or is located closer to point (P) than point (Q).

6. An LED package mounting structure comprising:
an LED package; and
a connection terminal portion disposed on a bottom face of the LED package, wherein:
the connection terminal portion is configured to connect to a circuit board,
the LED package mounting structure is mounted on the circuit board in such a manner that a light-emitting surface of the LED package is perpendicular to a mounting surface, in a cross section of the LED package mounting structure taken parallel to the light-emitting surface,
the connection terminal portion is formed in a curved shape at an end portion on a central side of the LED package, and
when an outline of solder is approximated to a curved line, an inclination of a tangent of the outline of the solder is continuous at an end (P) of the connection terminal portion.

7. A liquid crystal display comprising the LED package mounting structure according to claim 1.

8. A liquid crystal display comprising the LED package mounting structure according to claim 2.

9. A liquid crystal display comprising the LED package mounting structure according to claim 3.

10. A liquid crystal display comprising the LED package mounting structure according to claim 4.

11. A liquid crystal display comprising the LED package mounting structure according to claim 5.

12. A liquid crystal display comprising the LED package mounting structure according to claim 6.

13. The LED package mounting structure according to claim 1, wherein the curved shape curves away from the LED package and toward the circuit board.

14. The LED package mounting structure according to claim 5, wherein the curved shape curves away from the LED package and toward the circuit board.

15. The LED package mounting structure according to claim 6, wherein the curved shape curves away from the LED package and toward the circuit board.

* * * * *